United States Patent [19]

Hiwada et al.

[11] Patent Number: 5,404,564
[45] Date of Patent: Apr. 4, 1995

[54] HIGH SPEED DATA TRAIN GENERATING SYSTEM WITH NO RESTRICTION ON LENGTH OF GENERATED DATA TRAIN

[75] Inventors: Kiyoyasu Hiwada; Nobuyuki Kasuga, both of Tokyo, Japan

[73] Assignee: Hewlett-Packard Company, Palo Alto, Calif.

[21] Appl. No.: 184,856

[22] Filed: Jan. 21, 1994

Related U.S. Application Data

[63] Continuation of Ser. No. 606,767, Oct. 31, 1990, abandoned.

[30] Foreign Application Priority Data

Oct. 31, 1989 [JP] Japan ................. 1-284296

[51] Int. Cl.⁶ ............................................. G06F 7/00
[52] U.S. Cl. .............................. 395/800; 364/710.09; 364/717.5; 364/243.6; 364/244.8; 364/254.2; 364/DIG. 1; 364/965.9; 364/DIG. 2; 365/230.03; 365/230.05; 365/230.08

[58] Field of Search ......................... 395/800, 425; 365/230.03, 230.05, 230.08, 230.09; 370/60, 61, 93; 364/710.09, 710.14, 717.5

[56] References Cited

U.S. PATENT DOCUMENTS

| | | | |
|---|---|---|---|
| 3,702,462 | 11/1972 | England | 395/275 |
| 4,450,538 | 5/1984 | Shirasaka | 365/189.02 |
| 4,611,299 | 9/1986 | Hori et al. | 365/189 |
| 4,800,530 | 1/1989 | Itoh et al. | 165/189 |
| 4,802,132 | 1/1989 | Ohsawa | 365/230 |
| 4,807,191 | 2/1989 | Flannagan | 365/189 |
| 4,811,296 | 3/1989 | Garde | 365/189.02 |
| 5,016,226 | 5/1991 | Hiwada et al. | 365/233 |

*Primary Examiner*—Thomas G. Black
*Assistant Examiner*—Paul Harrity

[57] ABSTRACT

The present invention provides a data train generating system with no restriction on the number of data which can be generated at a high data rate by use of low-speed memory. A conditional mode may be used to change the data output sequence at an arbitrary time whereby the output is substantially uneffected by the operational speed of the memory used and the waiting time for the change to occur is reduced.

12 Claims, 6 Drawing Sheets

PRIOR ART Fig. 2

HIGH SPEED DATA TRAIN GENERATING SYSTEM WITH NO RESTRICTION ON LENGTH OF GENERATED DATA TRAIN

This is a continuation of application Ser. No. 07/606,767, filed Oct. 31, 1990, now abandoned.

FIELD OF THE INVENTION

The present invention relates to a data generator capable of generating a train of digital data at a high data rate.

BACKGROUND OF THE INVENTION

Digital word generators are well known in the prior art for generating a train of digital data. Referring to FIG. 1, a memory 403 stores desired output data and sequentially outputs the data in response to an address indicated by the address counter 401. The address selection is synchronized with a clock signal $f_{CLK}$ at an interval between a preset first address and a preset last address. Therefore, it follows that a train of corresponding data written between the first and last addresses of the memory are output from memory 403.

An address comparator 402 determines whether the address generated by the address counter 401 has reached the last address. Several data train output modes may be selected. When the address generated by the address counter is the last address, the output data train is terminated. Alternatively, the data train between the first and last addresses may be repeated by returning to the first address once again. Still another data train mode may repeat the data a predetermined number of times using a separate counter to count out each time the first counter reaches the last address. Furthermore, a different data train may be generated by rewriting the first and last addresses when a given number of repetitions are finished. Generating a different data train output may also be provided by a conditional mode causing the first and last addresses to be rewritten when the condition is satisfied. However, it is impossible to attain higher data rates due to a limited memory operating speed.

To cope with this drawback, the system depicted in FIG. 2 generates a data train at a higher speed than the memory operating speed. A n-divider 505 (n is a natural number) divides a frequency of the clock signal $f_{CLK}$ by n, and the n-divided clock signal is applied to the address counter 401. Addresses generated by the address counter 401 serve to specify addresses of a memory group, i.e., a memory 501 consisting of n-memory banks arranged in parallel. It follows that n-memory banks are simultaneously specified per address. Outputs of the respective banks are latched by their corresponding latches of a latch 502. Accordingly, latch 502 comprises n storage latches and provides output data at a rate $f_{CLK}/n$. The n latches are sequentially selected in time series by a multiplexer 503 triggering the data stored in the selected latch to be output. The data train output, therefore, is n-times higher than memory speed.

The data train can be generated at a much higher speed than the memory speed as n increases. However, since n is fixed, the number of data must be a multiple of n. Based on the prior art, if the number of data is not a multiple of n, the number of data is changed into a multiple by adding extra or insignificant data thereto. However, if the extra data are not added due to a restriction in practicable memory capacity, or because it creates a futility in terms of memory utilization by writing the data trains for several cycles, the data limitation to multiples of n becomes problematic.

Furthermore, the data train output sequence cannot be varied at the higher rate $f_{CLK}/n$ by the system shown in FIG. 2. Changes in the desired sequence may occur only by changing the first and last addresses in memory 501, and is, therefore, limited to the operation rate of the memory 501. Even if a conditional mode is used to change the data sequence, the desired change cannot take place until the latch 502 is triggered and new data is read from memory 501 into the latch 502. Therefore, an extra waiting time and a variable waiting time are required between the time a condition is met and the actual change in output data.

SUMMARY OF THE INVENTION

The present invention overcomes the problems in the prior art by providing a data train generating system capable of generating a pulse train at a high data rate with no restriction in the number of data.

In accordance with a preferred embodiment of the invention, a data train generating system comprises n-dividing means for n-dividing a frequency with a clock signal and having an output of the n-divided result. Address generating means having an input coupled to the output of the n-dividing means generates addresses between a first and last address at an output. First memory means comprises n-banks with each bank having an input coupled to the output of the address generating means and an output providing stored output data associated with the input addresses. A first multiplexer means sequentially selects output data from the first memory means in response to the clock signal. Second memory means having n-banks stores data. Second multiplexer means sequentially selects output data from the second memory means in response to the clock signals and third multiplexer means selects the outputs of the first and second multiplexer means.

In accordance with a particularly preferred embodiment of the invention, the first memory means may comprise a dual port memory means comprising n-banks each having one input port coupled to the output of the address generating means and another input port coupled to the output of the address generating means, each of the banks having a first and second output port coupled to the first multiplexer means and the second multiplexer means.

In still further accordance with this invention, the data train generating system may comprise first n-latch memory means having n-inputs, each input being coupled to one of the n-banks of said first memory means for receiving data associated with said input address and an output for each of said inputs coupled to said first multiplexer and second n-latch memory means having n-inputs, each input being coupled to one of the n-banks of said second memory means for receiving data associated with said input addresses and an output for each of said inputs coupled to the second multiplexer.

BRIEF DESCRIPTION OF THE DRAWINGS

The present invention will be better understood and its numerous advantages will become apparent by references to the following detailed description of the invention when taken in conjunction with the following drawings in which.

DETAILED DESCRIPTION OF THE INVENTION

Figure 1:
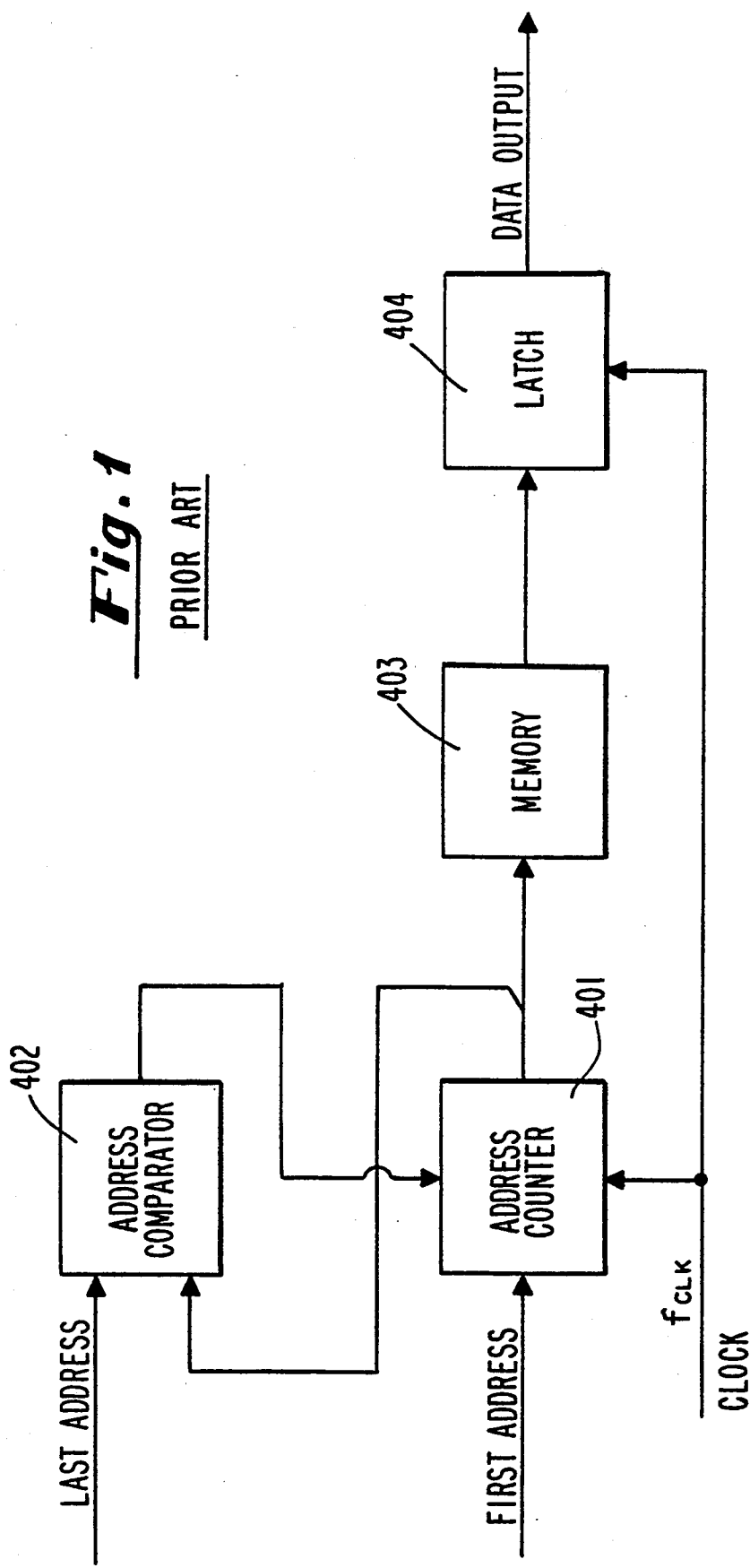
FIG. 1 is a block diagram schematically depicting a conventional data train generating system.
Figure 3:
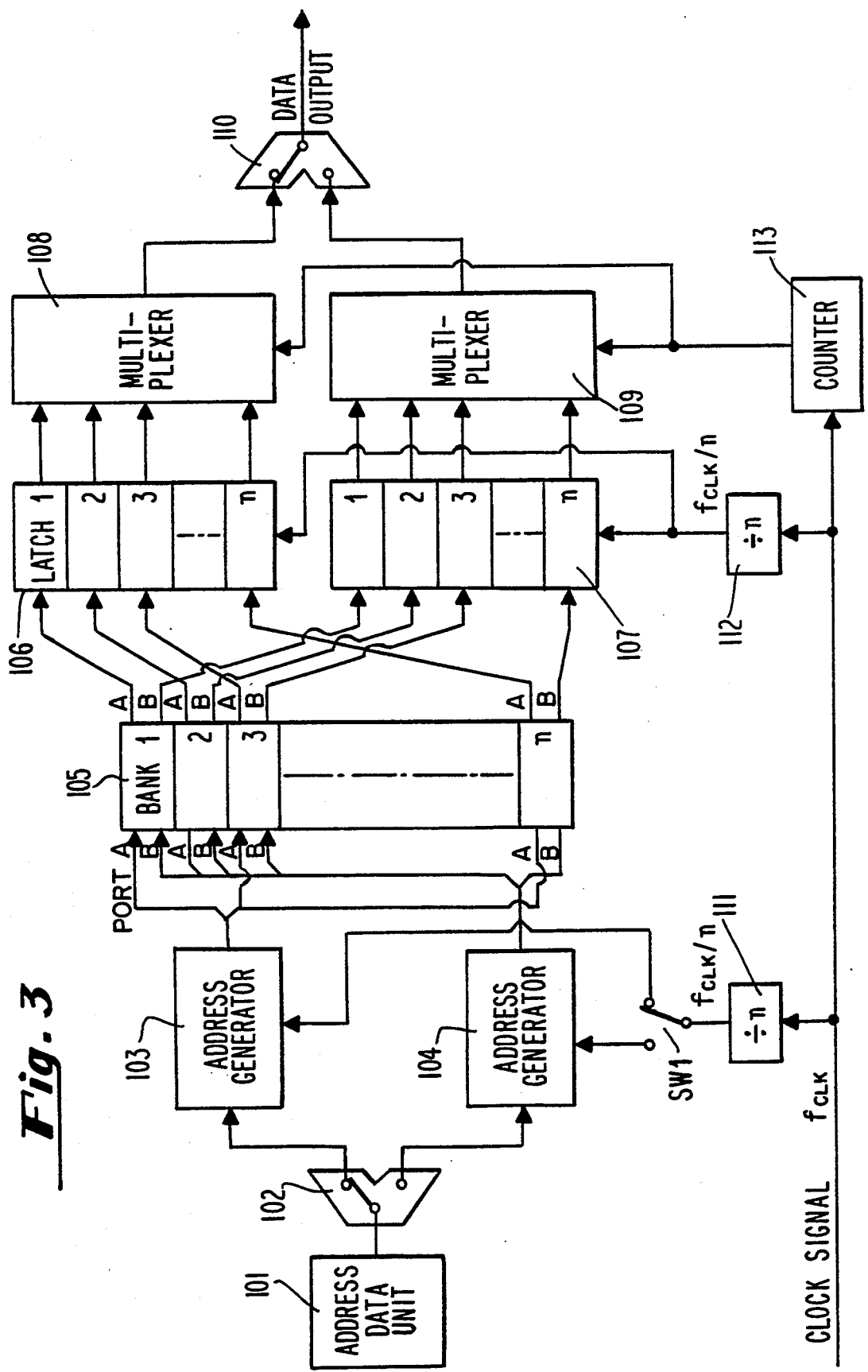
FIG. 3 is a block diagram showing a multiple port memory system according to the present invention.

One embodiment of the present invention is shown in FIG. 3. Each address generator 103 and 104 incorporates an address counter and an address comparator which are depicted in FIG. 1 and perform the same operations as those described herein above. A multiplexer 102 selectively inputs address data (first and last address) stored in the address data unit 101 to the address generators 103 and 104. The address generators 103 and 104 are selectively clocked via switch SW1 at a rate $f_{CLK}/n$, obtained by n-dividing a frequency of a clock signal $f_{CLK}$ by use of a n-divider 111. A main memory 105 composed of dual port bank memories having input ports A coupled to an output of the address generator 103 and input ports B coupled to an output of the address generator 104. Output ports A of the respective memories are coupled to corresponding slots of an n-slot latch 106. Output ports B are coupled to corresponding slots of an n-slot latch 107. Latching is synchronized with the clock rate $f_{CLK}/n$ obtained by n-dividing the frequency of the clock signal $f_{CLK}$ by a n-divider 112. Slot outputs from latch 106 are sequentially selected in time series by a multiplexer 108, and the selected output is coupled to one input of multiplexer 110. Slot outputs of latch 107 are sequentially selected in time series by a multiplexer 109, and the selected output is coupled to the other input of the multiplexer 110. Any one of the outputs of the multiplexers 108 and 109 is selected by the multiplexer 110, from which a desired pulse train is provided. The switch SW1 and the multiplexers 102 and 110 are switched simultaneously. Concurrently with this switching operation, the n-dividers 111 and 112 and n-counter 113 are reset.

To better understand the present invention, a preferred embodiment is described where the output data train is varied by a conditional mode of operation. In general, the A-port system and address generator 103 are selected by the multiplexers 102 and 110 and the switch SW1. When only this system is employed, the operation is identical with that explained in connection with FIG. 2.

When operating in the conditional mode, an address to be selected after the condition is satisfied is stored in the address generator 104 beforehand. If the condition is not established, as is often the case, only the address generator 103 generates the address, and the data of the A-port system are output in sequence, while the B-port system and the address generator 104 are not used. However, if the condition is established, the multiplexer 102 is switched to the address generator 104, while the multiplexer 110 is switched to the B-port system. Simultaneously, the output of the n-divider 111 is connected to the address generator 104 by switching the switch SW1 and the multiplexers 108 and 109 are respectively reset, the result being that the pulse train output operation is shifted to the address generator 104 and the B-port system. Thereafter, this system is continuously employed, while the address generator 103 and the A-port system terminate operation until a second condition is satisfied.

In this manner, the data corresponding to different addresses can be output regardless of the operating timing of memory 105. Furthermore, the output pulse train is provided at a higher data rate so long as latches 106 and 107 have a faster operating rate than the memory 105.

Where the dual port memories are not employed for the memory 105, latching still has to be executed after waiting for an address access time of the memory to output the data corresponding thereto. Eventually, a period equal to a waiting time up to the bank boundary is needed, with the result that a change in output data cannot be performed at an arbitrary time.

Where the dual port memories are employed, the problem pertaining to the access time can be eliminated by preparing the next address beforehand in the ports which are initially inoperative. When the condition is satisfied the data is already prepared in a latch, and it follows that the waiting time is not required.

Next consider data of an arbitrary number N which is not defined as a multiple of n, $$N = n*K + m$$

where K is the quotient obtained by dividing N by n, and m is the remainder.

In this case, while the address counter counts up to K, (n*K) data are outputted from the output of multiplexer 110 because n data can be outputted for one address.

After the next addressing, that is (K+1)th addressing by the address counter, assuming that the condition is satisfied after the mth (m is the remainder) data is outputted, a switching to the port B system would occur as described before. A signal indicating that data having a length N has been output is used instead of the condition satisfaction.

Where N<n, i.e., even one train is not completely output with respect to the bank memory, it is impossible to previously prepare the next data for the B-port system when the A-port system is changed over to the B-port system, if the A-port system operating time is shorter than the address access time of the memory. Hence, an operating time in the A-port system should be longer than the address access time of the memory.

Another illustrative example for understanding the present invention is provided when the system is operating in a conditional mode and the condition is satisfied at an arbitrary time while the number of data is not a multiple of n.

Figure 5:
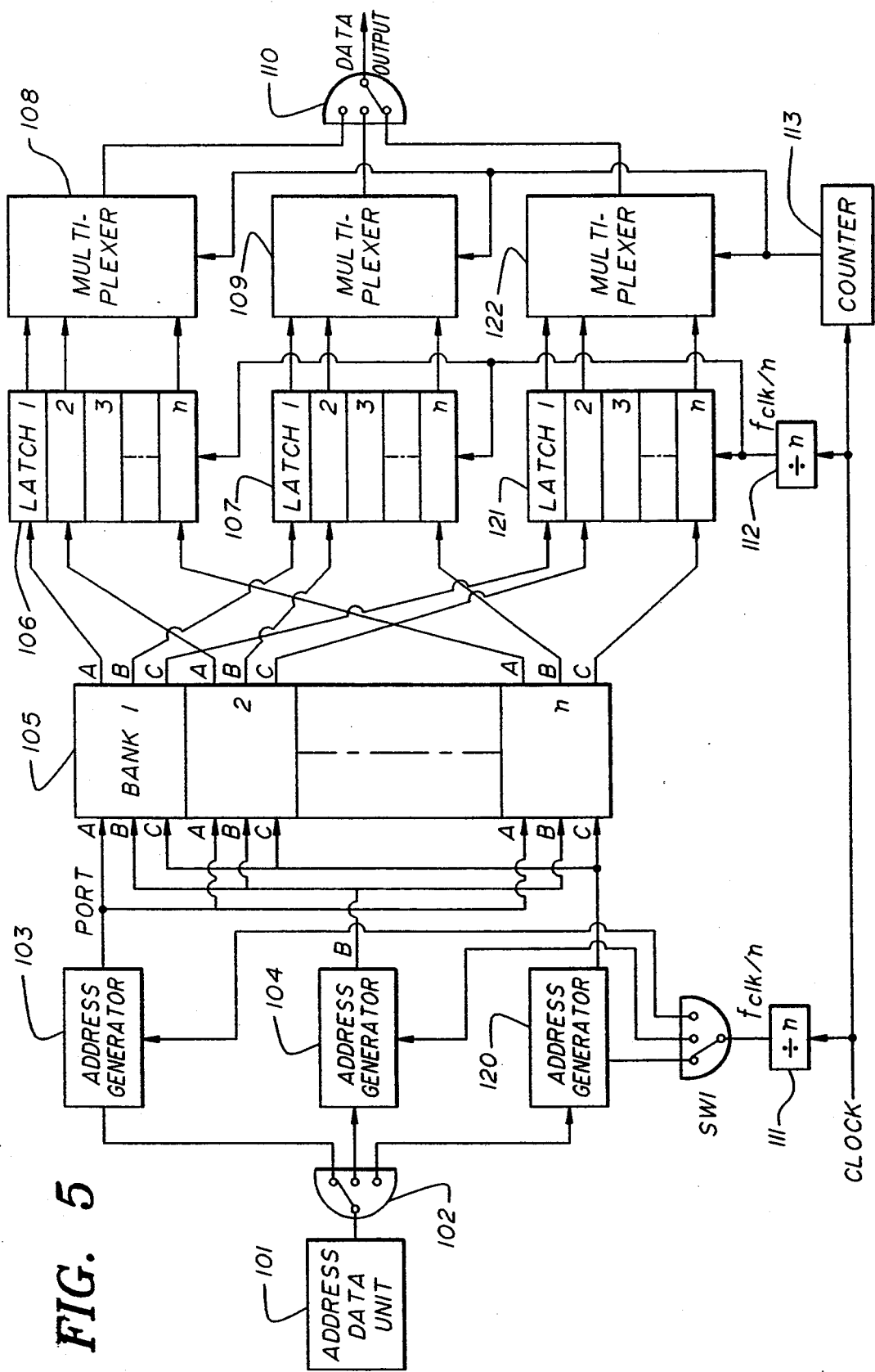
FIG. 5 is a block diagram showing a preferred embodiment of the multiple port memory system shown in FIG. 3.

In a preferred embodiment shown in FIG. 5, an additional system comprising an address generator 120 and corresponding latch 121 and multiplexer 122 is provided so that three systems are available. When any one of these systems is employed, the remaining two systems are allocated for operation in a case where the number of data is not a multiple of n and for the conditional mode, respectively. In this embodiment the main memory 105 is composed of triple port memories shown as A, B and C in FIG. 5.

The multiplexers 108 and 109 which have been discussed in the description, in preferred embodiments may be constructed of shift registers or latches having tristate outputs.

Figure 2:
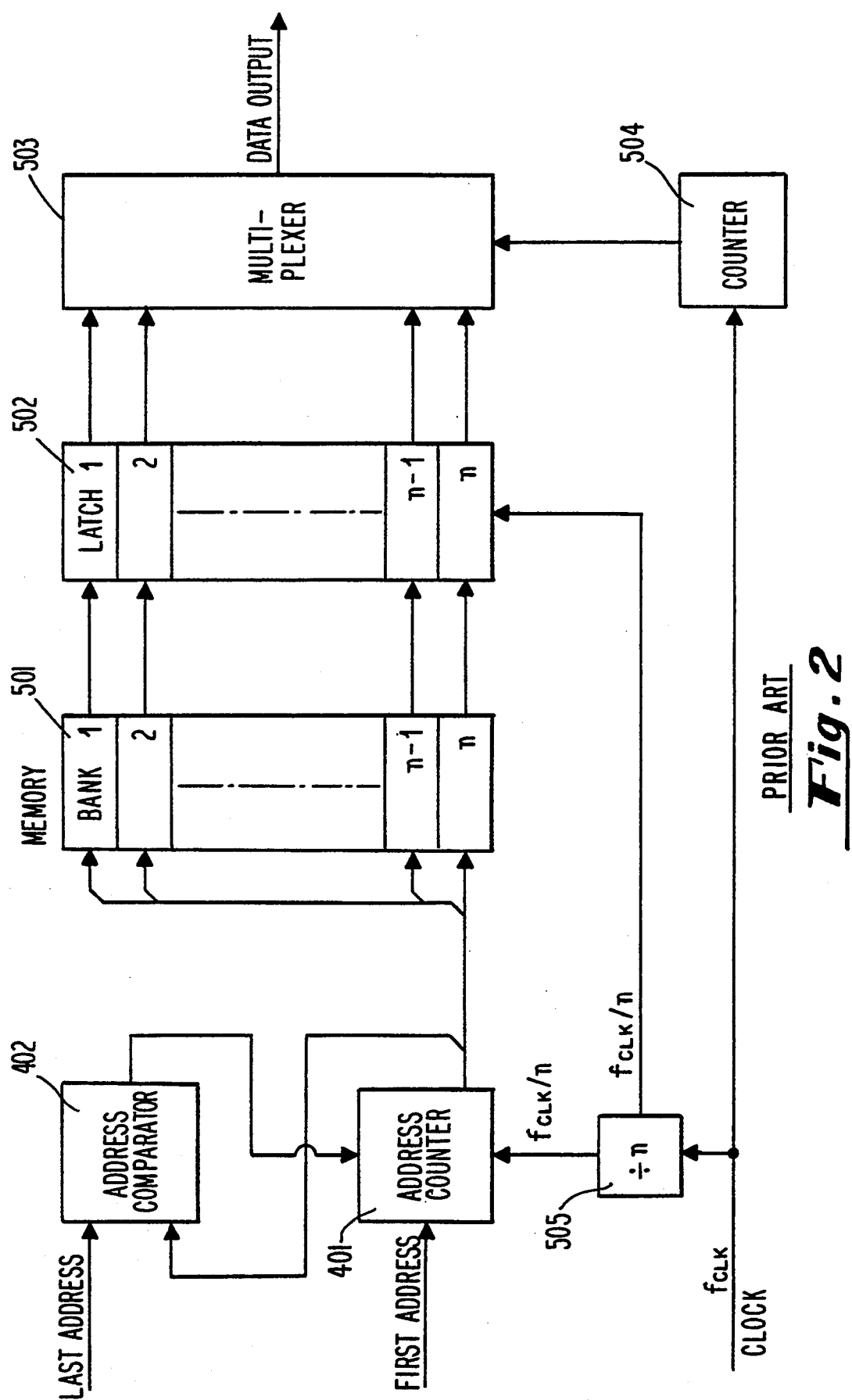
FIG. 2 is a block diagram schematically depicting a conventional system for generating a data train at a high speed by use of a low-speed memory.
Figure 4:
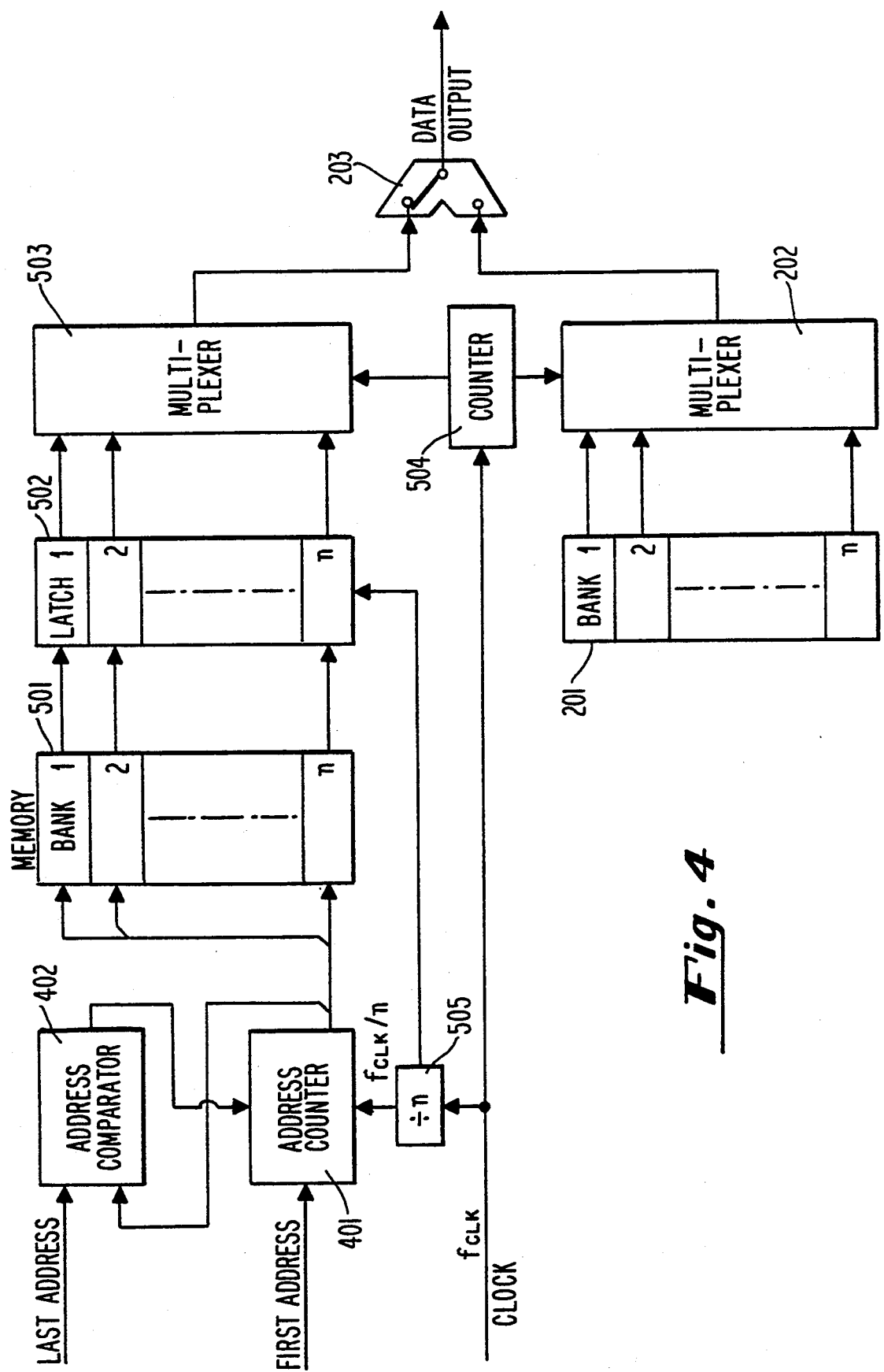
FIG. 4 is a block diagram showing a multiple memory system according to the present invention.

Referring to FIG. 4, a block diagram of a further preferred embodiment of the present invention is provided. In this embodiment, the components in addition to those shown in FIG. 2 are a bank memory or cache bank memory 201 for preparatorily storing data in n banks, a multiplexer 202 for sequentially selecting respective outputs of the respective cache bank memory 201 in time series, and a multiplexer 203 for selecting the outputs of the multiplexers 503 and 202.

Typically, the multiplexer 203 selects the multiplexer 503, while the multiplexer 202 remains inoperative. The system configuration and operation are identical with those shown in FIG. 2.

When a condition is satisfied, the multiplexer 202 is selected, and the n-divider 505 and the n-counter 504 are reset. Thereafter, the data stored in the n banks of cache bank memory 201 are sequentially output. After the nth sequence of data is output from memory 201, multiplexer 203 switches back to multiplexer 503 and the system reverts to the normal operating state. The data stored in memory 201 represents the desired output data after a condition is met. The data subsequent to (n+1)th data are previously stored in the memory 501. While the n data in the memory 201 are sequentially output, the address counter 401 outputs address data corresponding to the (n+1)th data in the memory 501.

The operations of the system shown in FIG. 4 is the same as that described for FIG. 3, when the data has a pulse length N that is not a multiple of n.

Figure 6:
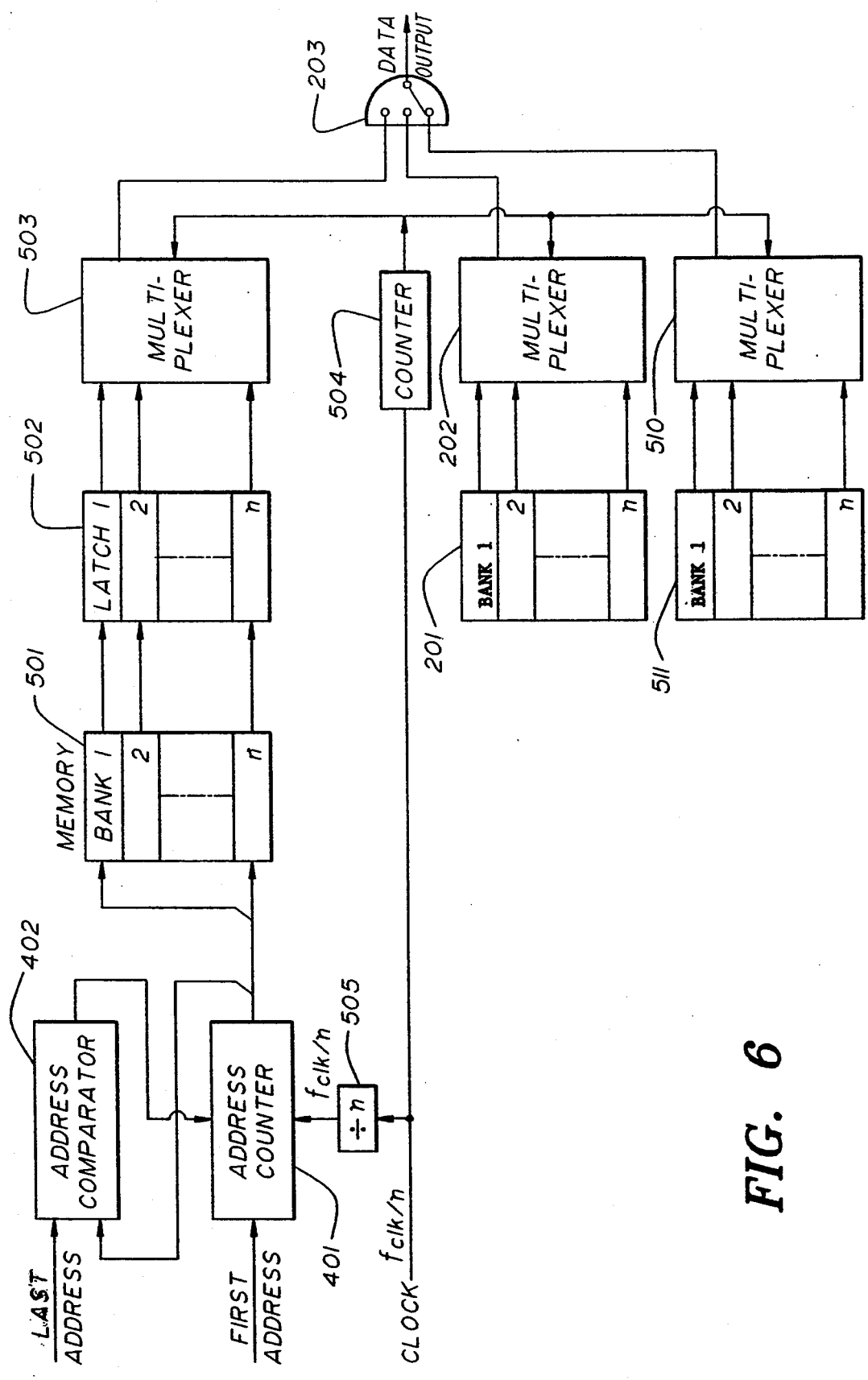
FIG. 6 is a block diagram showing a preferred embodiment of the multiple memory system shown in FIG. 4.

FIG. 6 is a block diagram of a preferred embodiment in which the data train generated has a length N and a condition may be satisfied at an arbitrary time.

Where the condition is established at an arbitrary time while generating data the number of which is not a multiple of n, an additional cache bank memory 511 and corresponding multiplexer 510 are further provided. One cache bank memory is used where the number of data is not a multiple of n, while the other is used for altering the data sequence after a condition is satisfied. In this configuration the multiplexer 203 preferably has three inputs.

The above-described multiplexers 503 and 202 may be shift registers or latches having tristate outputs.

While the invention, has been described and illustrated with references to specific embodiments, those skilled in the art will recognize that modification and variations may be made without departing from the spirit and scope of the invention as described herein above and set forth in the following claims.

What is claimed is:

1. A data train generating system comprising:
   address data generating means for generating an output of data being indicative of a first and a last address;
   n-dividing means for n-dividing a frequency of a clock signal and having an output of the n-divided frequency;
   first and second address generating means for generating an output of addresses between said first and last addresses in response to output signals of said n-dividing means;
   switch means for selecting the output of said n-dividing means and alternately coupling the output to one of said first and said second address generating means;
   first multiplexer means for selectively coupling the output of said address data generating means to said first and second address generating means;
   multiple port memory means for storing data associated with a desired output comprising n-banks, each of said n-banks having at least one input port A coupled to the output of said first address generating means and at least a second input port B coupled to the output of said second address generating means, each of said n-banks having at least one output port A and at least one output port B;
   first and second n-latch memory means for latching said data associated with a desired output and having an input coupled to the multiple port memory means, the first n-latch memory means having n input ports coupled to each n-bank output port A, the second n-latch memory means having n input ports coupled to each n-bank output port B;
   second multiplexer means for selecting output data from said first n-latch memory means, the data being associated with said input ports A in response to said clock signals;
   third multiplexer means for selecting output data from said second n-latch memory means, the data being associated with said input ports B in response to said clock signals; and
   fourth multiplexer means for outputting a train of data having a length defined by the relationship N=n*K+m, where K is an integer greater than or equal to one and m is less than n and greater than or equal to one, by selecting outputs of said second and third multiplexer means.

2. The system of claim 1, wherein said first multiplexer means selectively couples the output of said address data generating means to one of said first and second address generating means and said fourth multiplexer means selects outputs of said second and third multiplexer means based on an occurrence of a predetermined condition.

3. The system of claim 1, wherein said first multiplexer means selectively couples the output of said address data generating means from said first address generating means to said second address generating means and said fourth multiplexer means switches from selecting outputs of said second multiplexer means to said third multiplexer means when the data train generated has a length of N.

4. The system of claim 1, further comprising:
   third address generating means for generating an output of addresses between said first and last addresses in response to output signals of said n-dividing means;
   said switch means coupling the output of the n-dividing means to one of said first, second, and third address generating means;
   said first multiplexer means selectively coupling the output of said address data generating means to said first, second, and third address generating means;
   each of said n-banks of said memory means having a third input port coupled to said third address generating means and a corresponding third output port;
   third n-latch means for latching said data associated with a desired output and having an input coupled to said third output port of each of said n-banks of said memory means and having n outputs corresponding to each of the inputs thereto;

fifth multiplexer means for selecting output data from said third n-latch memory means; and said fourth multiplexer means selecting outputs of said second, third, and fifth multiplexer means.

5. The system of claim 4, wherein said first multiplexer means selectively couples the output of said address data generating means to one of said first, second, and third address generating means and said fourth multiplexer means selects outputs of said second, third, and fifth multiplexer means based on an occurrence of a predetermined condition.

6. The system of claim 5, wherein said first multiplexer means selectively couples the output of said address data generating means from said first address generating means to one of said third address generating means and said fourth multiplexer means switches from selecting outputs of said second multiplexer means to said fifth multiplexer means when the data train generated has a length N.

7. A data train generating system comprising:

n-dividing means for n-dividing a frequency of a clock signal and having an output of the n-divided frequency;

address generating means having an input coupled to said output of said n-dividing means for generating an output of addresses between a first and a last address;

first memory means comprising n-banks for storing data, each bank having an input coupled to the output of said address generating means and an output providing stored output data associated with said input addresses;

first multiplexer means for selecting output data from said first memory means in response to said clock signals;

second memory means having n-banks in which data is stored;

second multiplexer means for selecting output data from said second memory means in response to said clock signals; and third multiplexer means for outputting a train of data having a length N the defined by the relationship $N=n*K+m$, where K is an integer greater than or equal to one and m is less than n and greater than or equal to one, independent of the value of n by selecting outputs of said first and second multiplexer means.

8. The system of claim 2, wherein the third multiplexer means selects outputs of said first and second multiplexer means based on an occurrence of a predetermined condition.

9. The system of claim 7, wherein the third multiplexer means selects outputs from said first multiplexer means until the output data has a length of N and then selects outputs from said second multiplexer means.

10. The system of claim 7, further comprising:

a third memory means having n-banks in which data is stored;

a fourth multiplexer means coupled to an output of each of said n-banks of said third memory means for sequentially selecting output data from said third memory means; and said third multiplexer means selecting outputs of one of said, first, second, and fourth multiplexing means.

11. The system of claim 10, wherein said third multiplexer means selects outputs of said first, second, and fourth multiplexer means based on an occurrence of a predetermined condition.

12. The system of claim 11, wherein said third multiplexer means selects outputs from said first multiplexer means until the output data has a length of N and then selects outputs from one of said second and fourth multiplexer means.

* * * * *